United States Patent [19]

Tukahara

[11] Patent Number: 5,696,723

[45] Date of Patent: Dec. 9, 1997

[54] DEFECT RELIEF DECISION CIRCUIT WITH DUAL-FUSED CLOCKED INVERTER

[75] Inventor: Mitue Tukahara, Tokyo, Japan

[73] Assignee: NEC Corporation, Tokyo, Japan

[21] Appl. No.: 705,418

[22] Filed: Aug. 29, 1996

[30] Foreign Application Priority Data

Aug. 30, 1995 [JP] Japan ................................ 7-222396

[51] Int. Cl.⁶ ........................... G11C 7/00; G11C 17/14
[52] U.S. Cl. ..................... 365/200; 365/225.7; 365/233; 365/230.06
[58] Field of Search .................. 365/200, 225.7, 365/233, 230.06

[56] References Cited

U.S. PATENT DOCUMENTS

| | | | |
|---|---|---|---|
| 5,325,323 | 6/1994 | Nizaka | 365/225.7 |
| 5,373,471 | 12/1994 | Saeki et al. | 365/200 |
| 5,406,520 | 4/1995 | Tay | 365/200 |
| 5,426,614 | 6/1995 | Harvard | 365/225.7 |
| 5,457,656 | 10/1995 | Fu | 365/225.7 |
| 5,469,391 | 11/1995 | Haraguchi | 365/200 |

*Primary Examiner*—Joseph E. Clawson, Jr.

[57] ABSTRACT

Disclosed is a defect relief decision circuit which has: a selection circuit for deciding either of a normal memory cell and a redundant memory cell to be used by cutting a fuse; a first programming fuse circuit which is controlled by the output of the selection circuit and to which an address bit of an address signal is input; a plurality of second programming fuse circuits which is controlled by the output of the selection circuit and to which an address bit different from the address bit of the address signal is input; and a logical circuit to which the outputs of the first and second programming fuse circuits are input and which decides to perform a defect relief operation when these coincide.

4 Claims, 3 Drawing Sheets

| ADDRESS SIGNAL Ai | FUSE CIRCUIT OUTPUT FOi | COMPARATOR OUTPUT RAi |
|---|---|---|
| 0 | 0 | 1 |
| 0 | 1 | 0 |
| 1 | 0 | 0 |
| 1 | 1 | 1 |

DEFECT RELIEF DECISION CIRCUIT WITH DUAL-FUSED CLOCKED INVERTER

FIELD OF THE INVENTION

This invention relates to a defect relief decision circuit, and more particularly to, a defect relief decision circuit which is employed in a defect relief circuit used for a semiconductor memory.

BACKGROUND OF THE INVENTION

Recently, along with the use of a large semiconductor memory, it has been popularized to prepare redundant memory cells other than normal memory cell arrays. When a defect is found in the memory cells, the defect memory cell can be replaced by the redundant memory cell to relive the defective chip in the range of the prepared redundant memory cells. With the enlargement of semiconductor memory, the memory capacity of the redundant memory cells to be prepared has been increased. To replace the defective normal memory cell by the redundant memory cell, needed is a defect relief decision circuit which outputs a signal instructing the use of a redundant memory cell when a defect is found and which decides whether a memory cell corresponding to an address signal has a defect when the address signal is input. Since the defect relief decision circuit generally requires a complex circuit composition, a large number of elements are needed with the enlargement of semiconductor memory, thereby causing the increase in cost.

FIG. 1 shows the composition of a conventional defect relief decision circuit 101. As shown in FIG. 1, outputs FO1 to FOn of fuse circuits 1 to n in which an address signal of defective memory cell is programmed are input to comparators 11 to 1n with address signal bits A1 to An. Then, the comparators 11 to 1n decide whether the address signal bits A1 to An coincide with the Outputs FO1 to FOn, respectively. The output signals RA1 to RAn of the comparators 11 to 1n are then input to a NOR circuit 31. In addition to the fuse circuits 1 to n, provided is a fuse circuit 21 which programs whether a redundant memory (not shown) is to be used. The output of the NOR circuit 31 and a signal which are obtained inverting the output of the fuse circuit 21 by an inverter I1 are input to a NAND circuit 32. The output of the NAND circuit 32 is inverted by an inverter I2 to give a decision signal Red.

With reference to FIG. 2, operation in the fuse circuits 1 to n and fuse circuit 21 of the defect relief decision circuit 101 will be explained below. For example, provided is the case that there is a defect in an address signal in which address bits A1 and A2 of the address signal bits A1 to An are '1' and all the other address bits A3 to An are '0', i.e., (An, . . . , A3, A2, A1)=(0, . . . , 0, 1, 1). The fuse circuit 1 to n is composed of a fuse 41, a resistance R1 and inverters I3, I4.

Here, after testing a semiconductor memory in wafer state by a memory tester, the fuses 41 of the fuse circuits 1, 2 and the fuse 41 of the fuse circuit 21 for deciding whether the redundant memory cell is to be used are cut by laser beam, and the other fuses remain connected.

As shown in FIG. 2, when the fuse 41 is cut, the input of the inverter I3 is clamped to GND (ground potential) through the resistance R1 to output '1' from the inverter I3. Thus, the outputs FO1, FO2 of the fuse circuits 1, 2 become '0'. On the other hand, in the fuse circuits other than the fuse circuits 1, 2, the inputs of the inverters I3 are connected to Vcc through the fuses 41 since the fuses 41 thereof are not cut. Herein, since the resistivity of the fuse 41 is several hundred ohm significantly lower than that of the resistance R1, the input of the inverter I3 becomes '1'. Thus, all the outputs FO3 to FOn of the fuse circuits other than the fuse circuits 1, 2 become '1'.

With reference to FIG. 3, operation in the comparators 11 to 1n will be explained below. In FIG. 3, If both an address signal Ai and an output FOi of the fuse circuit are '0', P-channel transistors P3, P4 turn on, N-channel transistors N1, N4 turn off and N-channel transistors N2, N3 turn on. Therefore the output RAi becomes '1'. In summarizing the operation in the comparators 11 to 1n, the truth table for the comparators 11 to 1n is as shown in FIG. 4. Namely, if the address signal Ai and the output FOi of the fuse circuit coincide, the output RAi of the comparator becomes '1', and if they do not coincide, the output RAi becomes '0'.

Furthermore, the operation in the defect relief decision circuit 101 will be explained below.

First, explained is the case that a redundant memory cell is used. After testing in wafer state, there is a defect in a memory cell corresponding to an address signal, for example; where address bits A1, A2 are '1' and all the other address bits A3 to An are '0'. In this case, since the fuses 41 of the fuse circuits 1, 2 are in advance cut by laser beam, both the outputs FO1, FO2 of the fuse circuits 1, 2 are '0' and all the outputs FO3 to FOn of the other fuse circuits 3 to n are '1'.

Here, if an address signal A=(0, . . . , 0, 1, 1) where both address bits A1, A2 are '1' and all the other address bits A3 to An are '0' is input to the comparators 11 to 1n, all the outputs RA1 to RAn of the comparators 11 to 1n, as shown in FIG. 4, become '0' since all the two inputs in the comparators 11 to 1n do not coincide. Therefore the NOR circuit 31 outputs '1'.

The fuse 41 of the fuse circuit 21 is cut in advance after testing in wafer state since it uses a redundant memory cell, thereby outputting '0'. Thus the inverter I1 outputs '1'. Both the two inputs of the NAND circuit 32 are '1' and the NAND circuit 32 therefore outputs '0'. As a result, the decision signal Red of the defect relief decision circuit is '1'. When the decision signal Red is '1' the decision signal Red activates a selector circuit (not shown) for redundant memory cell as well as deactivating a selector circuit (not shown) for normal memory cell to replace the defective normal memory cell by a redundant memory cell.

Here, if an address signal A' different from the above address signal A=(0, . . . , 0, 1, 1), for example, A'=(0, . . . , 0, 1, 0) is input to the comparators 11 to 1n, the comparator 11 outputs '1' since both the two inputs of the comparator 11 are '0'. In the comparators 12 to 1n, all the outputs RA2 to RAn are '0' since the two inputs do not coincide similarly to the above. Thus, since the output. RA1 of the comparator 11 is '1', the output of the NOR circuit 31 becomes '0' and the decision signal Red therefore becomes '0'. In this case, the defect relief decision circuit 101 decides not to use the redundant memory cell for the address signal A'=(0, . . . , 0, 1, 0) and controls to access a normal memory cell when receiving the access demand to memory cell.

Next, in the case that there is not a defect in the memory cell and the redundant memory cell is not used, the output of the fuse circuit 21 is '1' and the output of the inverter I1 is '0' since the fuse 41 of the fuse circuit 21 is not cut. As a result, the decision signal Red of the defect relief decision circuit 101 becomes '0'. The decision signal Red activates the selector circuit for normal memory cell as well as deactivating the selector circuit for redundant memory cell to access the normal memory cell.

In the conventional defect relief decision circuit, there is a problem that the chip area has to be increased since the circuit has the complicated composition and requires a large number of elements. Since the memory capacity will be rapidly increased hereafter as well as the increase in the bit number of address signal, the large number of elements will cause a further serious problem. Furthermore, when the fuses 41 of the fuse circuits 1 to n are not cut, the amount of circuit current must be increased since a DC current continues to flow through the fuse 41 and the resistance R1 from a power source Vcc. Moreover, as seen from FIGS. 1 and 3, since it is required to pass five gates from the input of the address signal A1 to An into the comparators 11 to 1n to output of the decision signal Red, the delay time is increased to be disadvantageous to high speed operation.

SUMMARY OF THE INVENTION

Accordingly, it is an object of the invention to provide a defect relief decision circuit in which the number of elements is significantly decreased.

It is a further object of the invention to provide a defect relief decision circuit in which the continuous current flow inside the circuit is removed.

It is a still further object of the invention to provide a defect relief decision circuit in which the number of gates required for an address signal to pass from the input to the output of the circuit is decreased to perform high-speed operation.

According to the invention, a defect relief decision circuit, comprises:

- a selection circuit for deciding either of a normal memory cell and a redundant memory cell to be used by cutting a fuse;
- a first programming fuse circuit which is controlled by the output of the selection circuit and to which an address bit of an address signal is input;
- a plurality of second programming fuse circuits which is controlled by the outpost of the selection circuit and to which an address bit different from the address bit of the address signal is input; and
- a logical circuit to which the outputs of the first and second programming fuse circuits are input and which decides to perform a defect relief operation when these coincide;
- wherein each of the first and second programming fuse circuits comprises a clocked inverter which is activated by the output of the selection circuit when the redundant memory cell, a first fuse which has a first contact connecting to the output terminal of the clocked inverter and a second contact connecting to the output terminal of the first or second programming fuse circuit, and a second fuse which has a first contact connecting to the input terminal of the clocked inverter and a second contact connecting to the output terminal of the first or second programming fuse circuit, and either of the first and second fuses is cut in response to an address bit of an address signal corresponding to the redundant memory cell.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
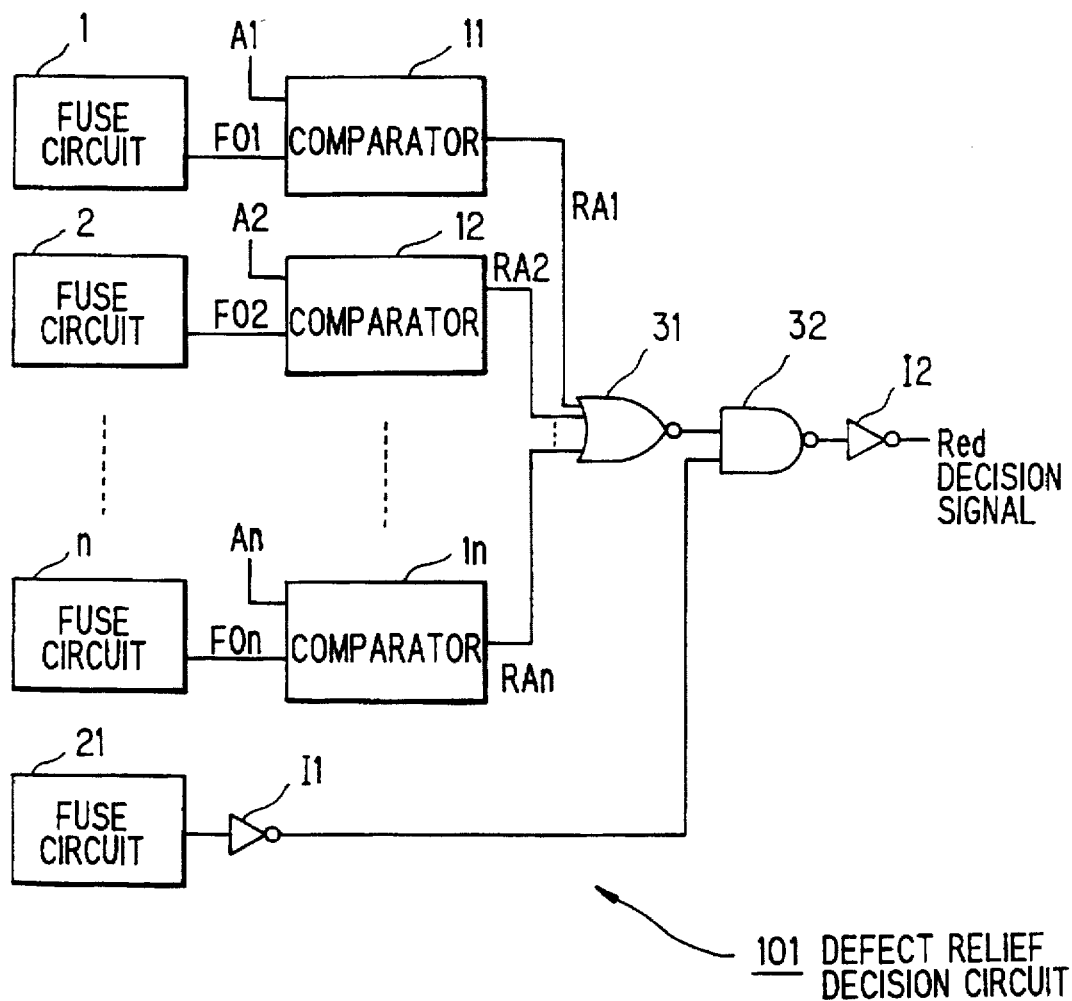
FIG. 1 is a block diagram showing a conventional defect relief decision circuit.
Figure 2:
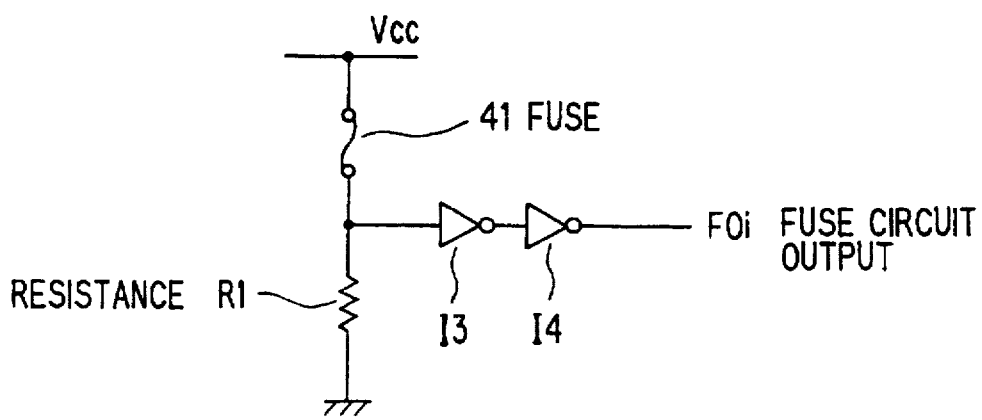
FIG. 2 is a circuit diagram showing a fuse circuit in the conventional defect relief decision circuit.
Figures 3, 4:
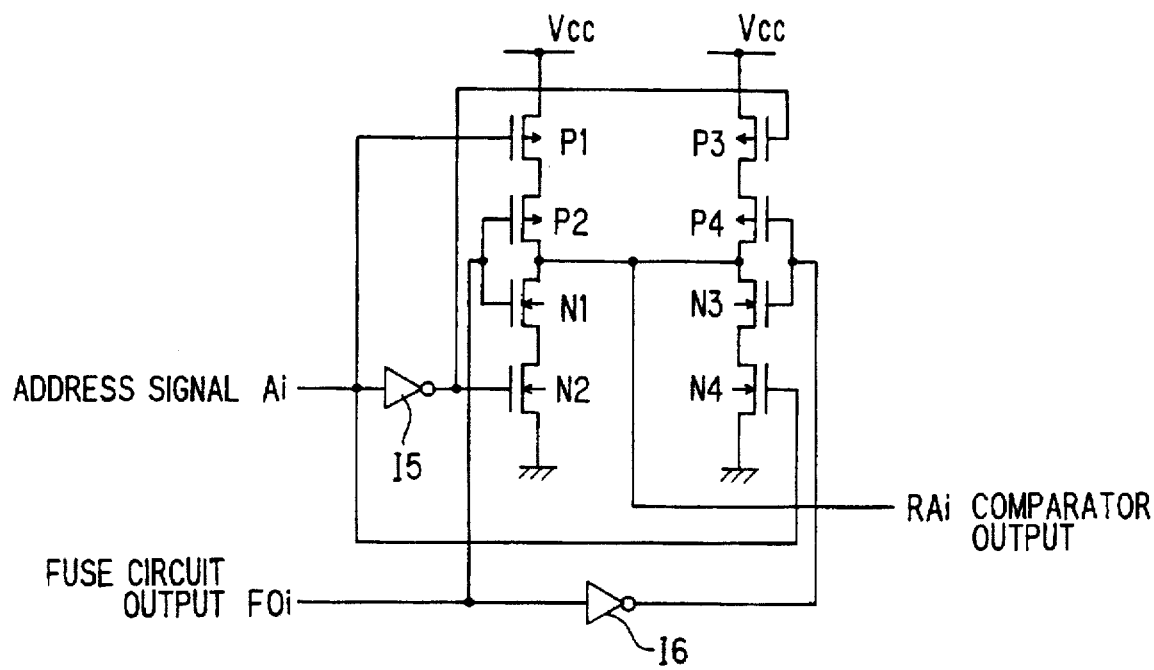
FIG. 3 is a circuit diagram showing a comparator in the conventional defect relief decision circuit.
FIG. 4 shows a truth table in the comparator in the conventional defect relief decision circuit.
Figure 5:
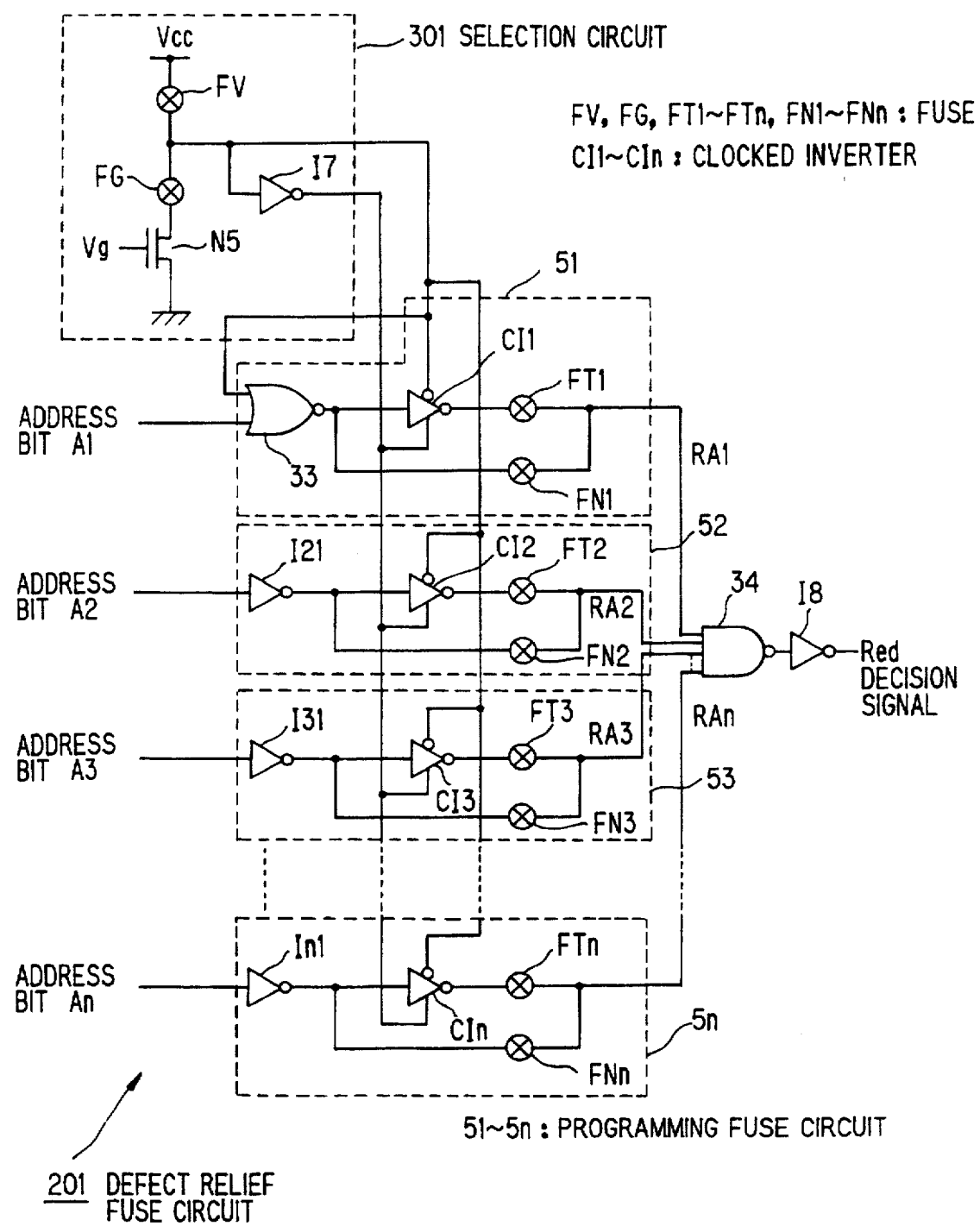
FIG. 5 is a circuit diagram showing a defect relief decision circuit in a preferred embodiment according to the invention.

A defect relief decision circuit in the preferred embodiment will be explained in FIG. 5.

A defect relief decision circuit 201 in the embodiment is provided with a selection circuit 301, programming fuse circuits 51 to 5n, a NOR circuit 33, a NAND circuit 34 and an inverter I8. The programming fuse circuits 51 to 5n are provided with the NOR circuit 33 or inverters I21 to In1, clocked inverters CI1 to CIn, fuses FT1 to FTn and fuses FN1 to FNn.

First, explained will be the case that there is not a defect in a memory cell corresponding to an address signal and a redundant memory cell is not used. After testing by the memory tester in wafer state, only a fuse FG of the fuses FG, FV, FT1 to FTn and FN1 to FNn is in advance cut by laser beam. Herein, since the input of the inverter I7 is clamped through the fuse FV to Vcc, the output of the inverter I7 becomes '0'. Thus, all the clocked inverters CI1 to CIn take high impedance. Since one input of the NOR circuit 33 is clamped to Vcc, the output of the NOR circuit 33 becomes '0'. This output signal is input through the fuse FN1 to the NAND circuit 34, the output of the NAND 34 is therefore '1' regardless of the address signal and the decision signal Red of the defect relief decision circuit 201 is '0'. The decision signal Red activates a selector circuit for normal memory cell (not shown) as well as deactivating a selector circuit for redundant memory cell (not shown) to access a normal memory cell. In the defect relief decision circuit 201, when the redundant memory cell is not used, the efficiency in cutting work can be improved since only the fuse FG has to be cut by laser beam and the other fuses can be connected.

Next, explained will be the case that there is a defect in a memory cell corresponding to an address cell and a redundant memory cell is used. For example, the case is that there is a defect in a memory cell corresponding to an address signal A in which address bits A1 and A2 are '1' and all the other address bits are '0', i.e., A=(An, ..., A3 A2, A1)=(0, ..., 0, 1, 1).

After testing in wafer state, the fuse FV of the selection circuit 301, fuses FN1, FN2 and fuses FT3 to FTn are in advance cut by laser beam. The gate of N-channel transistor N5 is biased with Vg which is a voltage around ½ of a power source voltage and the N-channel transistor N5 turns on. Thus, the N-channel transistor N5 can operate to prevent an excessive current to flow through the fuses FV, FG from the power source Vcc to GND before the fuses FV, FG are cut.

The input of the inverter I7 becomes '0' to activate all the clocked inverters CI1 to CIn. Since one input of the NOR circuit 33 becomes '0', the NOR circuit 33 outputs the inverted signal to the address bit A1 to equivalently operate to the inverters I21 to In1.

Now, when the address signal A=(0, ..., 0, 1, 1) is input to the programming fuses 51 to 5n, the address bit A1 is inverted by the NOR circuit 33 and clocked inverter CI1, respectively to output '1' from the output RA1 of the clocked inverter CI1. Similarly, the address bit A2 is inverted by the inverter I21 and clocked inverter CI2, respectively to output '1' from the output RA2 of the clocked inverter CI2. Since the fuse FT3 is cut, the address bit A3 to be inverted by the inverter I31 is input through the fuse FN3 to the NAND circuit 34 as a signal RA3. Since the address bit A3 is '0', the signal RA3 becomes '1'. Hereinafter, similarly, all the input signals RA1 to RAn are '1'. As a result, the decision signal Red of the defect relief decision circuit 201 becomes '1'. The decision signal Red activates the selector circuit for redundant memory cell as well as deactivating the selector circuit for normal memory cell to replace the defective normal memory cell by a redundant memory cell.

Here, if an address signal A' different from the above address signal A=(0, ..., 0, 1, 1), for example, A'=(0, ..., 0, 1, 0) is input to the programming fuse circuits 51 to 5n, the address bit A1 is inverted by the NOR circuit 33 and clocked inverter CI1, respectively to output '0' from the output RA1 of the clocked inverter CI1. Thus, the decision signal Red of the defect relief decision circuit 201 becomes '0'. The defect relief decision circuit 201 operates such that when an address signal different from the address signal corresponding to a defective memory cell is input, the decision signal '0' is output not to use the redundant memory cell but to access the normal memory cell.

Since the defect relief decision circuit 201 in this embodiment is composed of the clocked inverters CI1 to CIn, fuse circuits FT1 to FTn and FN1 to FNn, the number of circuit elements can be significantly decreased comparing to the conventional defect relief decision circuit 101. Moreover, in the defect relief decision circuit 201, there is no current path flowing a DC current as in the conventional defect relief decision circuit 101. Therefore, the amount of circuit current can be significantly reduced.

In the defect relief decision circuit 201, it is decided by cutting either the fuses FT1 to FTn or the fuses FN1 to FNn that the input signals RA1 to RAn of the NAND circuit 34 can be taken from which of the inputs and outputs of the clocked inverters CI1 to CIn. Hereupon, discussed will be the case that all the clocked inverters CI1 to CIn are replaced by inverters.

In the case that the clocked inverters CI1 to Cin are replaced by inverters (not shown), when there is not a defect, all the fuses FT1 to FTn and fuses FN1 to FNn remain connected. Thus, in all the inverters corresponding to the clocked inverters CI1 to CIn, the inputs and outputs are connected. Therefore, the input voltage of the inverters is equal to the input threshold voltage thereof, thereby flowing through the inverters themselves. To prevent this, all the fuses FT1 to FTn or all the fuses FN1 to FNn have to be in advance cut not to feedback from outputs to inputs of the inverters. The efficiency in fuse cutting work will be significantly reduced. Accordingly, the defect relief decision circuit 201 has advantages in that the amount of circuit current can be significantly reduced and the cutting portion by laser beam is only one particularly when a redundant memory cell is not used.

Furthermore, the defect relief decision circuit 201 in this embodiment can be operated in higher speed since only four gates from input to output thereof, which are less than the number of gates required in the conventional defect relief decision circuit 101, is required.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A defect relief decision circuit, comprising:

a selection circuit for deciding either of a normal memory cell and a redundant memory cell to be used by cutting a fuse;

a first programming fuse circuit which is controlled by the output of said selection circuit and to which an address bit of an address signal is input;

a plurality of second programing fuse circuits which is controlled by the output of said selection circuit and to which an address bit different from said address bit of said address signal is input; and a logical circuit to which the outputs of said first and second programming fuse circuits are input and which decides to perform a defect relief operation when these coincide;

wherein each of said first and second programming fuse circuits comprises a clocked inverter which is activated by the output of said selection circuit when said redundant memory cell, a first fuse which has a first contact connecting to the output terminal of said clocked inverter and a second contact connecting to the output terminal of said first or second programming fuse circuit, and a second fuse which has a first contact connecting to the input terminal of said clocked inverter and a second contact connecting to the output terminal of said first or second programming fuse circuit, and either of said first and second fuses is cut in responses to an address bit of an address signal corresponding to said redundant memory cell.

2. A defect relief decision circuit, according to claim 1, wherein:

said logical circuit is composed of a NAND circuit to the output terminal of which an AND circuit or an inverter is connected.

3. A defect relief decision circuit, according to claim 1, wherein:

said first or second fuse is cut in response to '1' or '0' of said address bit of said address signal corresponding to said redundant memory cell.

4. A defect relief decision circuit, according to claim 1, wherein:

said selection circuit comprises a fuse for said redundant memory cell which has a first contact connecting to a power source, a fuse for a normal memory cell which has a first contact connecting to a second contact of said fuse for said redundant memory cell, and a MOS transistor in which a drain is connected to a second contact of said fuse for said normal memory cell and a source is connected to ground potential and a gate is connected to a bias voltage source, and wherein said fuse for said normal memory cell is cut when said redundant memory cell is not used and said fuse for said redundant memory cell is cut when said redundant memory cell is used, whereby activating said clocked inverters.

* * * * *